United States Patent [19]
Schuppert, Jr. et al.

[11] Patent Number: 5,165,837
[45] Date of Patent: Nov. 24, 1992

[54] APPARATUS FOR FEEDING ARTICLES FROM TUBE MAGAZINES

[75] Inventors: Leo V. Schuppert, Jr., York; Kerry J. Stakem, Hummelstown, both of Pa.

[73] Assignee: AMP Incorporated, Harrisburg, Pa.

[21] Appl. No.: 651,671

[22] Filed: Feb. 6, 1991

[51] Int. Cl.⁵ .............................. B65G 59/06
[52] U.S. Cl. ...................... 414/417; 29/741; 414/797.4; 414/18; 414/222; 198/747; 198/749; 221/198; 221/251
[58] Field of Search ............ 198/747, 748, 749; 29/741, 709, 33 M, 809; 414/749, 750, 222, 403, 416, 417, 797.4, 225, 797.9, 18, 226; 221/11, 198, 251

[56] References Cited

U.S. PATENT DOCUMENTS

| | | | |
|---|---|---|---|
| 3,308,977 | 3/1967 | Cochran et al. | 414/417 X |
| 4,355,938 | 10/1982 | Page | 414/222 |
| 4,599,026 | 7/1986 | Feiber et al. | 414/126 |
| 4,623,293 | 11/1986 | Brown et al. | 414/126 |
| 4,636,126 | 1/1987 | Spotts | 414/126 |
| 4,650,391 | 3/1987 | Adlon et al. | 414/222 |
| 4,670,977 | 6/1987 | Scrantom eet al. | 414/417 X |
| 4,670,978 | 6/1987 | Fickes et al. | 29/741 |
| 4,690,302 | 9/1987 | Zebley et al. | 29/741 X |
| 4,717,304 | 1/1988 | Bocchicchio et al. | 414/126 |
| 4,718,531 | 1/1988 | Bianchi et al. | 193/17 |
| 4,776,747 | 10/1988 | Swapp et al. | 414/417 |
| 4,843,712 | 7/1989 | Hellstern | 29/741 X |
| 4,862,578 | 9/1989 | Holcomb | 29/564 |

FOREIGN PATENT DOCUMENTS

| | | | |
|---|---|---|---|
| 244713 | 12/1985 | Japan | 414/417 |
| 88537 | 4/1987 | Japan | 414/417 |
| 191321 | 8/1987 | Japan | 414/797.4 |
| 191322 | 8/1987 | Japan | 414/797.4 |
| 6405103 | 11/1965 | Netherlands | 414/417 |
| 722817 | 3/1980 | U.S.S.R. | 198/747 |

Primary Examiner—Frank E. Werner

[57] ABSTRACT

Component feeder for feeding comonents (8) from a tube magazine (2) comprises a pusher (44) on the end of a flexible steel tape (48) which extends from a tape housing (52). A filled tube (2) is supported on retractable pins (30, 30') in alignment with the pusher (44) and in alignment with a pickup station. The tape (48) is fed by feed rolls (50) so that the pusher (44) moves through the tube magazine (2) and feeds the components (8) along a guide track (36) to the pickup station. When the tube supported on pins (30, 30') is empty, the pusher (44) is retracted to its housing, the pins (30, 30') are retracted, and the empty tube falls on a conveyor belt (88) which carries it from the machine. A full tube (2) is then dropped onto the pins (30, 30') by a further pair of pins (32, 32') and (34, 34') which are moved between extended and retracted positions to control the movement of the filled tube which is supplied from an inventory of filled tubes supported on the pins (32, 32').

3 Claims, 11 Drawing Sheets

APPARATUS FOR FEEDING ARTICLES FROM TUBE MAGAZINES

FIELD OF THE INVENTION

This invention relates to feeding apparatus of the type used to feed individual articles, particularly electronic components, from tube magazines to a pickup station at which the individual articles are picked up by a transfer device and placed in an assembly such as a circuit board.

BACKGROUND OF THE INVENTION

It is common practice to package electronic components, such as connectors, integrated circuits, sockets, and the like in extruded tubes which have an interior cross-section that conforms to the shape of the articles or components. The components are simply placed in the interior of the tube, and the ends of the tube are closed during shipment. When the articles, or components, are placed in service, a feeding apparatus is used which automatically feeds the individual articles from one end of the tube to a pickup station of an assembly machine. A robot or similar transfer device picks up the article located at the pickup station and places it on a circuit board or other device which is being assembled.

Some of the previously known types of feeding devices depend upon gravity to move the articles from the tubes and to the pickup station: see, for example, U.S. Pat. Nos. 4,718,531, 4,636,126, and 4,599,026. Other types of feeding apparatus hold the tube in a horizontal attitude and feed the articles from one end of the tube along a horizontal feed path over a guide track to a pickup station; see, for example, U.S. Pat. No. 4,862,578. Feeding apparatus of this type are usually arranged to support a plurality of tubes, one on top of the other, and have a system for ejecting a tube after the articles have been fed therefrom and automatically place another filled tube in position for the article feeding process.

The present invention is directed to the achievement of a horizontal type feeding apparatus having a means for positively feeding the articles from the tube to the pickup station. The invention is particularly directed to an improved means for feeding the articles from the tube to the pickup station and to improvements in positioning the article in a precise location at the pickup station.

THE INVENTION

In its broadest aspect, the invention comprises an apparatus for delivering articles, such as electronic components, to an article pickup station and comprises a feed track having first and second ends. The pickup station is adjacent to the second end, and a reciprocable feeder is provided which is reciprocable between the first and second ends. The feeder comprises a rigid article pusher and a flexible tape, the pusher having a leading end and a trailing end. The tape is connected to the trailing end of the pusher and extends through tape feed rolls to a tape housing which is adjacent to the first end of the feed track. The tape extends from the trailing end of the housing through the feed rolls and is coiled in the housing and is extensible and retractable from the housing. The feed track has guiding and confining surfaces extending from the first end to the second end which conform to the shape of the article. Feed roll control means are provided for rotating the feed rolls so that upon placement of at least one article on the track at the first end and upon actuation of the feed rolls in the direction which causes extension of the tape, the pusher will be moved along the feed track towards the second end and will push the article to the second end and to the pickup station.

In accordance with a further aspect, the invention comprises apparatus for feeding electronic components from a tube magazine to a pickup station, the tube magazine comprising an elongated hollow tube having first and second ends. The articles are in end-to-end or side by side relationship in the tube, and the apparatus comprises a tube support and an article feeding means for feeding the articles from the tube to the pickup station which is adjacent to and spaced from the second end of the tube. The apparatus is characterized in that the article feeding means comprises a flexible tape, tape feeding means, and control means. The tape is contained in a tape housing which is located adjacent to the first end of the tube. The tape has a leading end portion which extends from the housing and which has an article pushing means thereon, the article pushing means being in alignment with the first end of the tube of the beginning of an operating cycle. The control means is programmed to actuate the tape feeding means and feed the tape from the housing and through the tube towards the second end whereby the article pushing means on the leading end portion of the tape pushes the articles from the second end of the tube to the pickup station. Advantageously, the feeding means comprises feed rolls which are located between the tape housing and the article pushing means, and the article pushing means comprises a rigid article pusher which conforms to the interior cross-section of the tube and which is connected to the leading end portion of the tape.

THE DRAWING FIGURES

FIGS. 3A and 3B are views similar to FIGS. 2A and 2B showing the positions of the parts during ejection of an empty tube and placement of a filled tube in feeding position.

THE DISCLOSED EMBODIMENT

Figures 1, 2A:
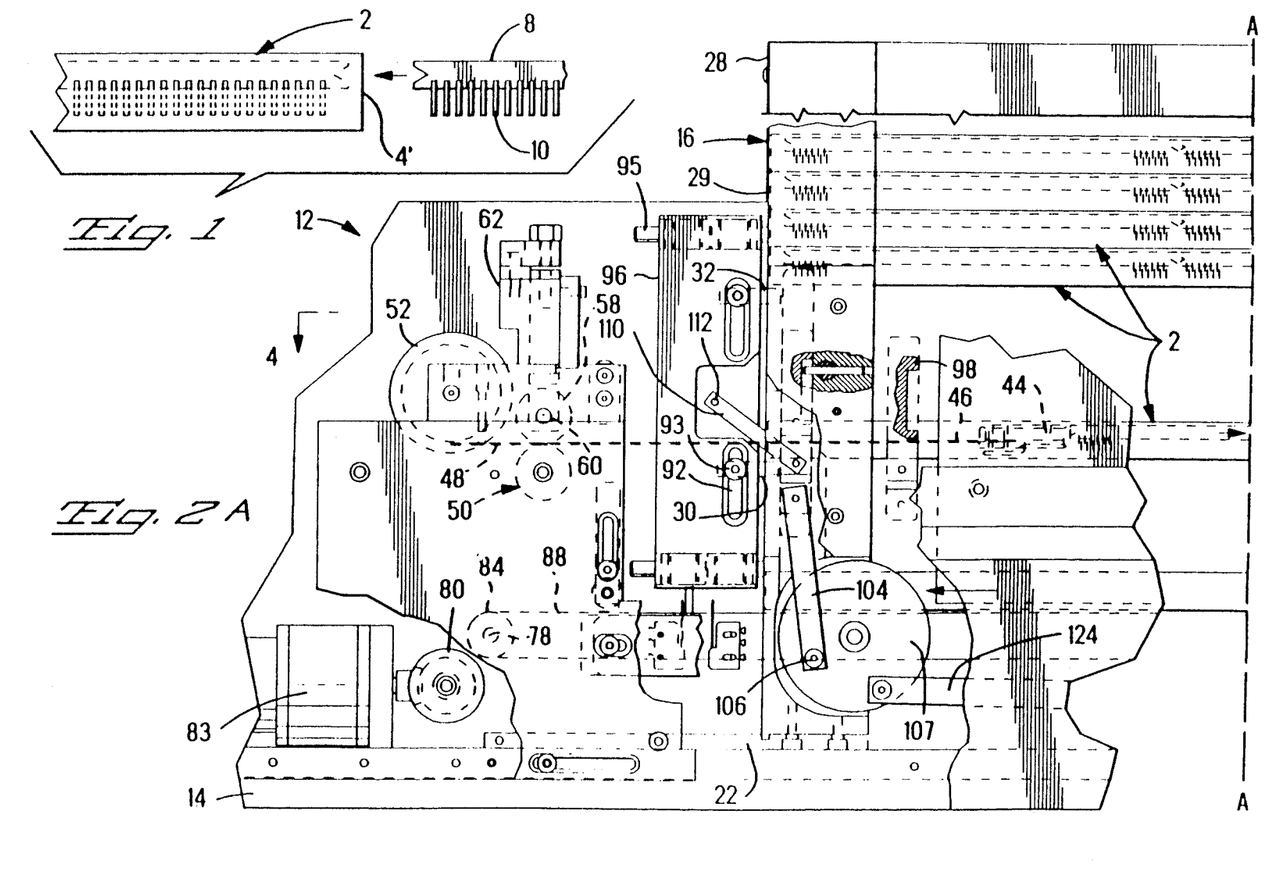
FIG. 1 shows a tube magazine and an electronic component exploded from, and in alignment with, the tube magazine.
FIG. 2A is a side view of the left side portion of an apparatus for the practice of the invention and FIG. 2B shows the right-hand side. These views show the positions of the parts when a tube magazine is in feeding position.

FIG. 1 shows a typical tube magazine 2 having first and second ends 4, 4' and containing a plurality of electronic components 8. The components may be of any desired type, for example, integrated circuit devices, connectors, socket members, etc. The component 8 which is disclosed has an elongated prismatic body and has leads 10 extending from its lower surface and arranged in two spaced-apart rows. The components are loaded into the magazine 2 at the time of manufacture and the open ends of the tube are temporarily plugged for shipment. When the components are placed in service, the individual components are fed from the tubes to a pickup station in a feeding and dispensing apparatus 12 as described below.

The apparatus 12, FIGS. 2A-12, is supported on a horizontal base plate 14 which in turn would be supported on a support surface. The apparatus 12 would, in use, be part of an assembly apparatus including a robot having fingers 42 for picking up a component at a pickup station shown at the right in FIG. 2B.

The apparatus comprises first and second column assemblies 16, 16' which are spaced-apart by a distance substantially equal to the length of the tube magazines 2 which it is intended to receive. The column assemblies 16, 16' are similar to each other in most respects so that a description of one will suffice for both, and the same reference numerals, differentiated by prime marks, will be used to identify corresponding structural elements in the two column assemblies. In the description which follows, only the first column assembly 16 is described in detail, and features of the second column assembly 16' are noted where appropriate.

Figure 4:
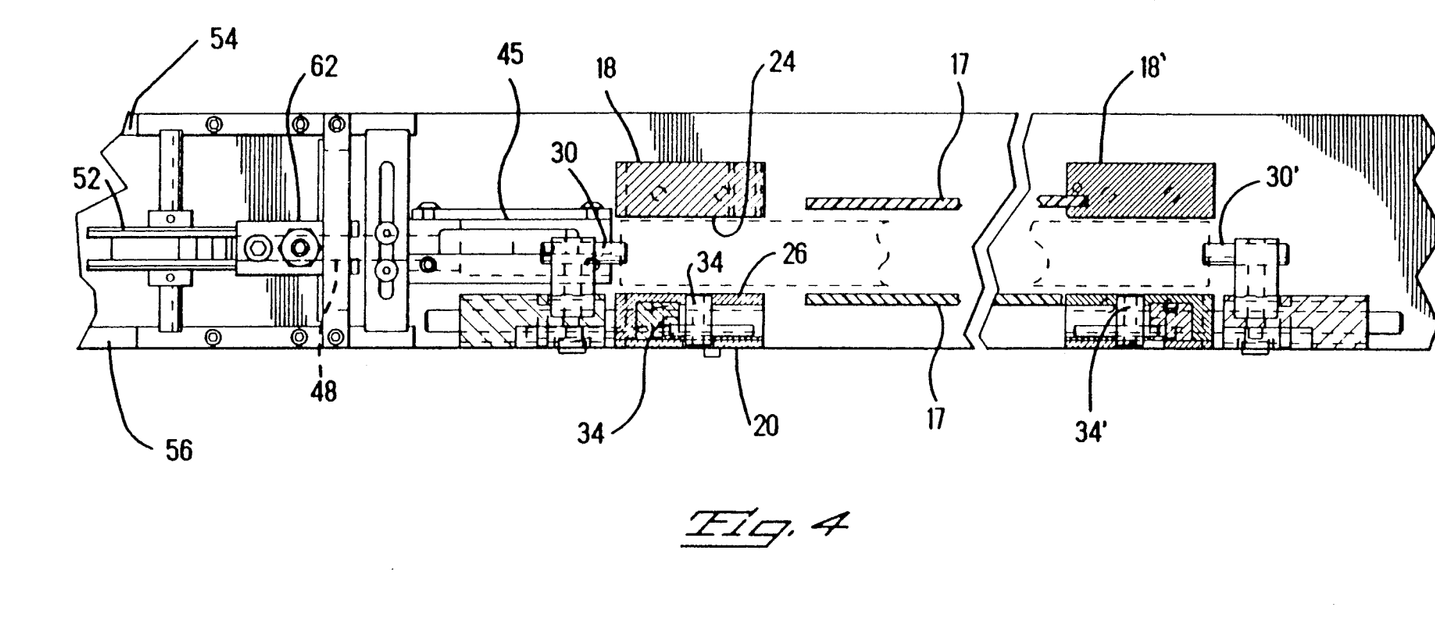
FIG. 4 is a fragmentary sectional view taken along the lines 4—4 of FIGS. 2A and 2B.

The column assembly 16 comprises two individual spaced-apart column members 18, 20. FIG. 4, which are secured to an adaptor or foot plate 22 which in turn is secured to the base plate 14. The column members 18, 20 have opposed internal surfaces 24, 26 which are spaced-apart by a distance slightly greater than the thickness of a tube magazine so that the tubes will be supported between the first and second column assemblies and will be confined by the surfaces 24, 26. A cover plate 28 is fastened to the leftwardly facing sides of the column members to confine the tube magazines against axial movement. The lower edge 29 of the cover plate is spaced from the plate 22 for the reason that clearance must be provided for the pusher 44 and pins 30, 32 which move into the space between the surfaces 24, 26. panels 17 extend between columns 18,18' and between columns 20,20'.

Figure 2B:
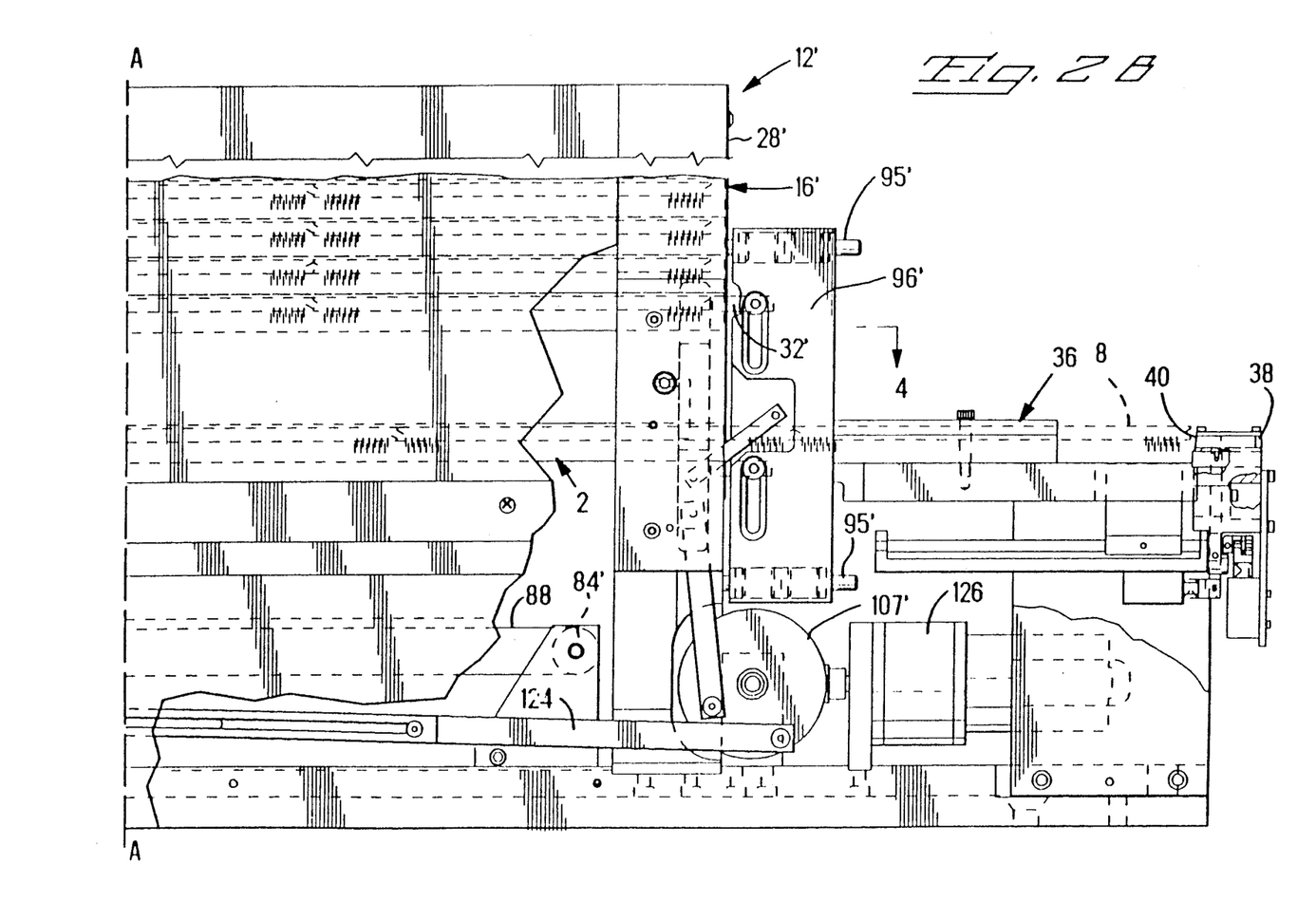
Figure 5:
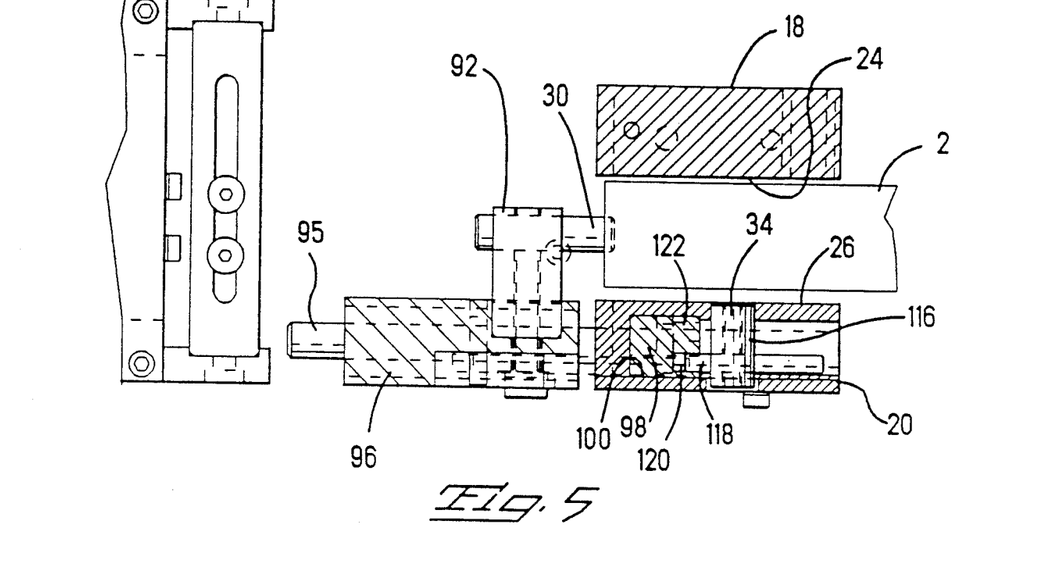
FIG. 5 is an enlarged view showing the left-hand portion of FIG. 4.
Figure 6:
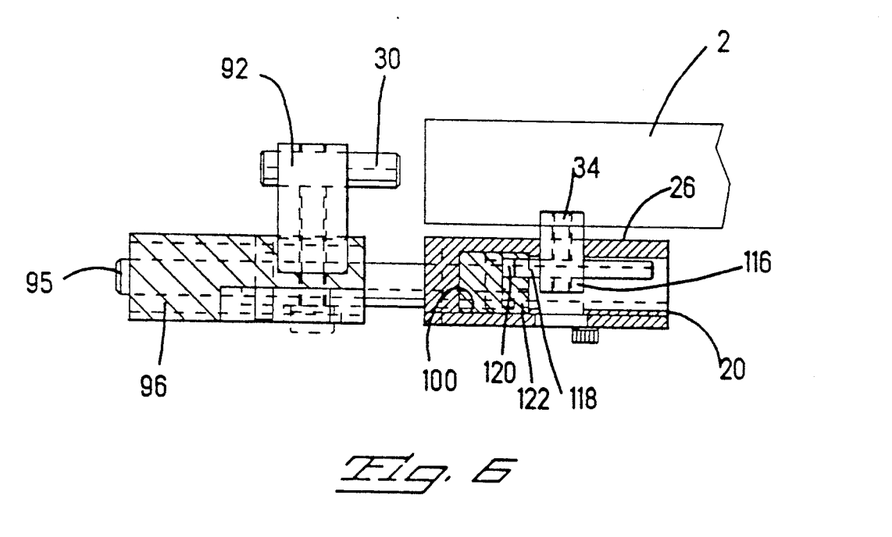
FIG. 6 is a view similar to FIG. 5 showing the positions of the parts during ejection of an empty tube.

The lowermost tube 2 shown in FIGS. 2A and 2B is supported on pins 30, 30' which are part of the two column assemblies and which extend beneath the lowermost tube. Additionally, upper supporting pins 32, 32' are provided which support an inventory of filled tube magazines 2 which are dispensed, one at a time, to the lowermost pins 30, 30' when the lowermost tube is empty. An intermediate set of pins 34, 34', shown in FIGS. 4-6, are also provided which move between retracted and extended positions (FIGS. 5 and 6) when an empty tube is being removed as will be described below.

A guide track assembly 36 extends rightwardly from the column assembly 16' and is in alignment with the tube 2 which is in feeding position and is supported on pins 30, 30'. In the disclosed embodiment, this guide track is dimensioned such that it can be straddled by the two rows of leads 10 which extend from the component 8. At the end of the guide track, there is provided a fixed stop block 38 which contains a sensor and which contains a leftwardly facing stop surface 40. This stop surface defines the pickup station in that the component located against surface 40 is precisely located so that it can be picked up by the arm 42 of a robot and transferred from the pickup station to a further work station in the machine, see FIGS. 10 and 11.

The individual components are fed from the tube magazine, which is in feeding position and supported on the pins 30, 30', by a rigid pusher 44 that has a cross-section which conforms to the cross-section of the interior of the tube magazine. The trailing end of the pusher 44 is connected to the leading end portion 46 of a flexible tape 48. The tape extends from the pusher through a feed roll assembly 50 and into a cylindrical tape housing 52 which is adjacent to the first column assembly.

The tape and tape housing are of the type used for steel measuring tapes and need not be described in detail. The tape is coiled within the housing and a spring is provided in the housing to retract the tape after it has been pulled from the housing. The tape may be of a medium carbon steel such as AISI 1095 which is formed with a camber. Such carbon steel tapes are conventionally fully hardened to a Rockwell hardness of 62 and then tempered until the Rockwell hardness is in the range of about 48-52. Tapes suitable for the practice of the invention are commercially available, for example, in widths of 0.25 inches (6.3 mm) and 0.50 inches (12.7 mm). Under some circumstances, as where the components and tube magazines are relatively small, it is necessary to use a 0.25 inch tape and such tapes are entirely satisfactory for pushing small components which have a relatively low mass. Where larger components are involved, the tube will necessarily have greater inside dimensions and a 0.5 inch width tape is used.

The feed roll assembly 50 and the tape housing (FIG. 8) are contained and supported between spaced-apart side plates 54, 56 which are secured to, and which extend vertically from the foot plate 22 which is supported on base plate 14. The feed roll assembly comprises an upper idler feed roll 58 which is rotatably supported on a shaft 60 in a frame or housing 62. A spring is provided in the housing 62 to adjust the force exerted by the upper feed roll on the lower feed roll 66. The lower roll 66 is keyed or otherwise secured to a shaft 68 which has a pulley 70 on its end. A drive belt 72 extends over pulley 70, around an idler pulley 74, around a pulley 76 on a shaft 78, around a pulley 80 on a shaft 82 and then back to the pulley 70. The idler pulley is adjustably supported as shown at 75 to permit adjustment of the tension in the belt. Shaft 82 is the power shaft and is coupled by a right angle drive to a motor 83 which is controlled by the control system of the machine. Motor 83 is reversible so that rotation in one direction causes the feed rolls to withdraw the tape 48 from its housing 52 and movement of the pusher 44 through a tube 2 which is in feeding position and rotation in the opposite direction retracts the tape and pusher.

Figure 7:
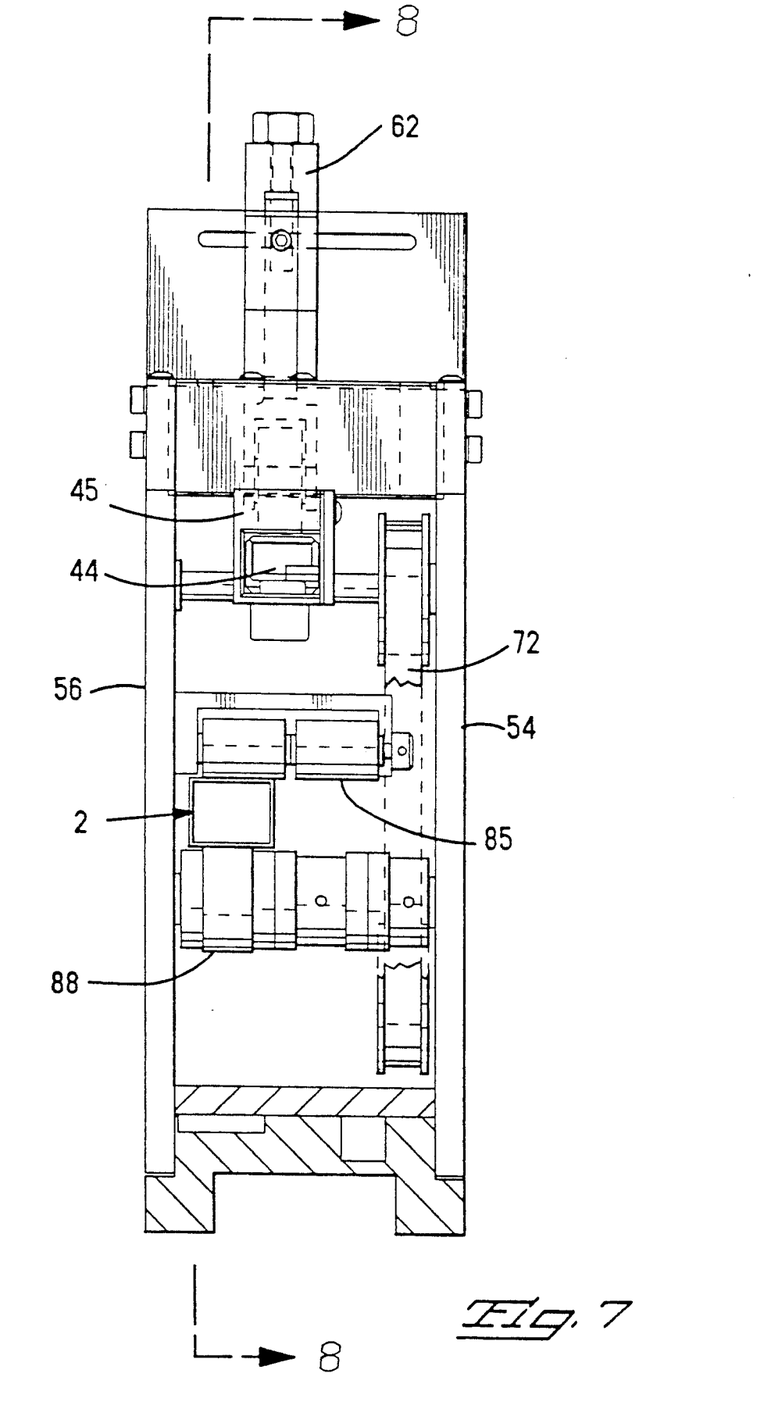
FIG. 7 is a view looking in the direction of the arrows 7—7 of FIG. 3A.
Figure 7B:
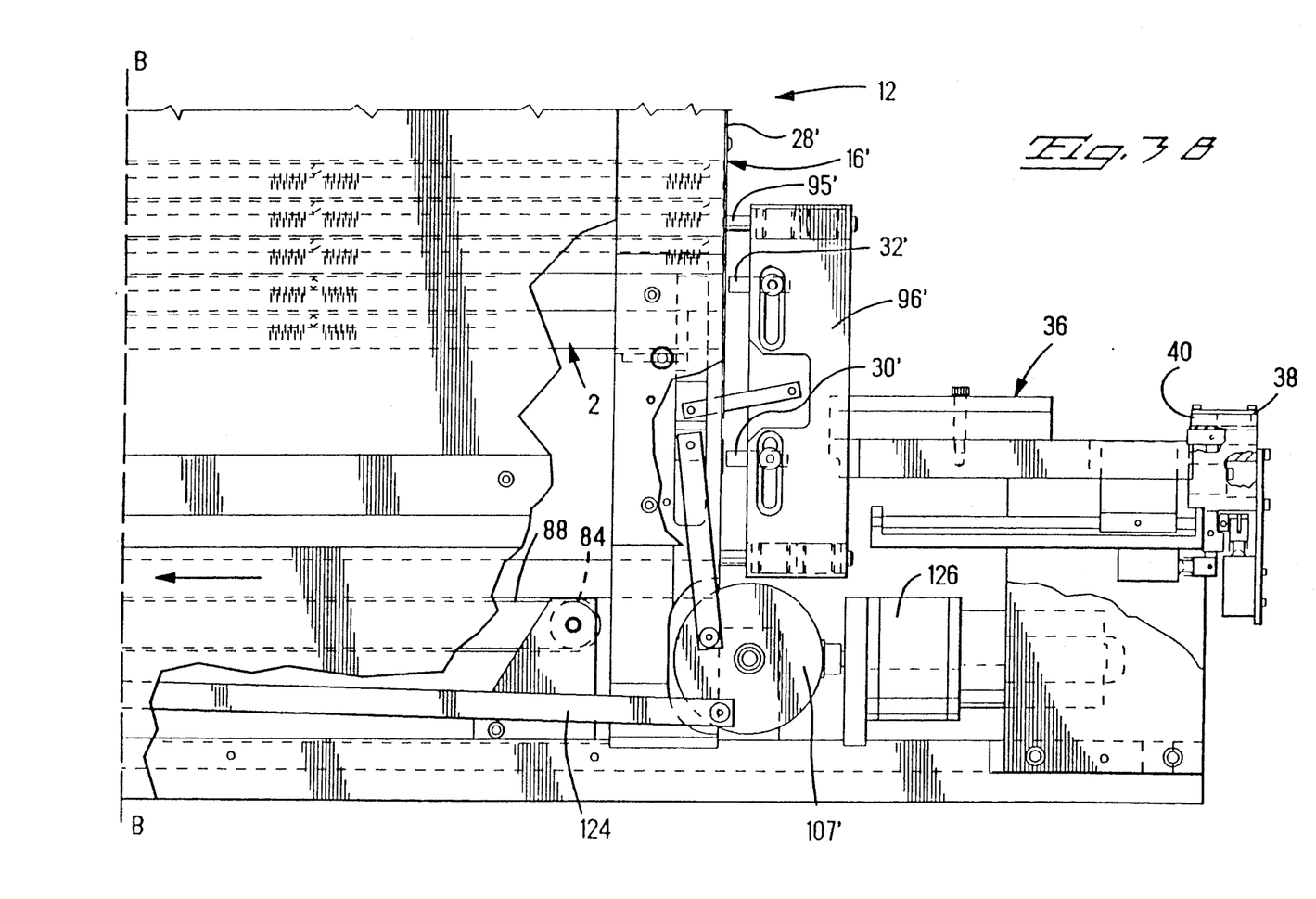
Figure 8:
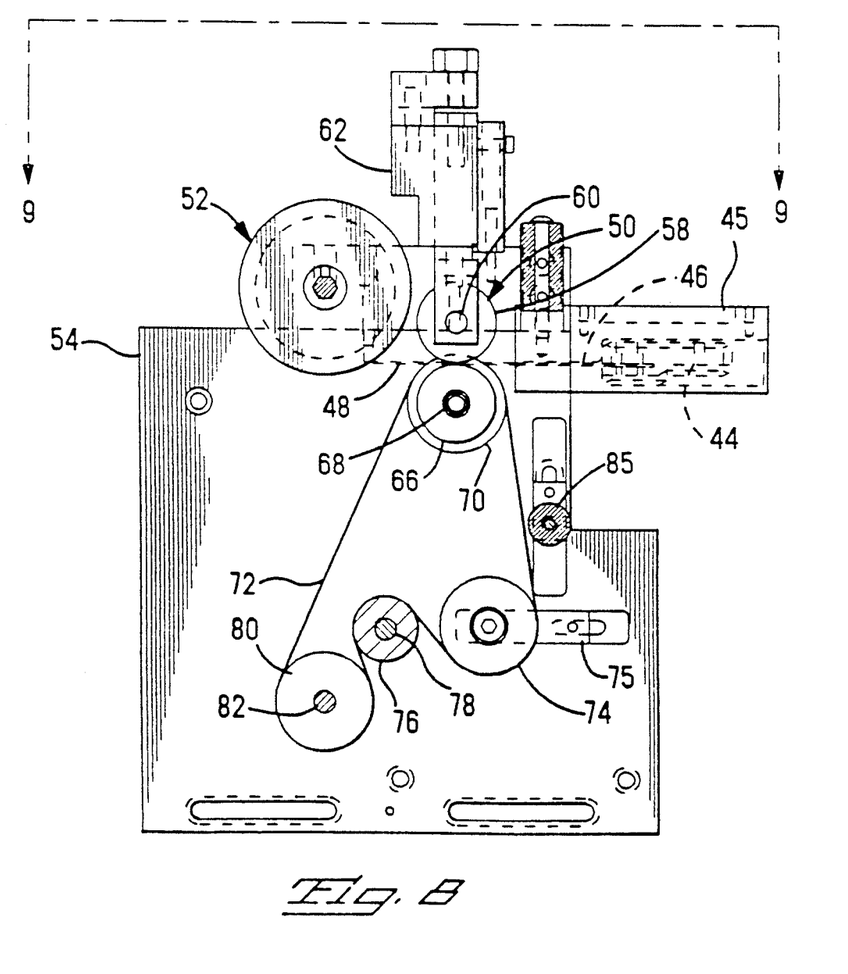
FIG. 8 is a view looking in the direction of the arrows 8—8 of FIG. 7.
Figure 9:
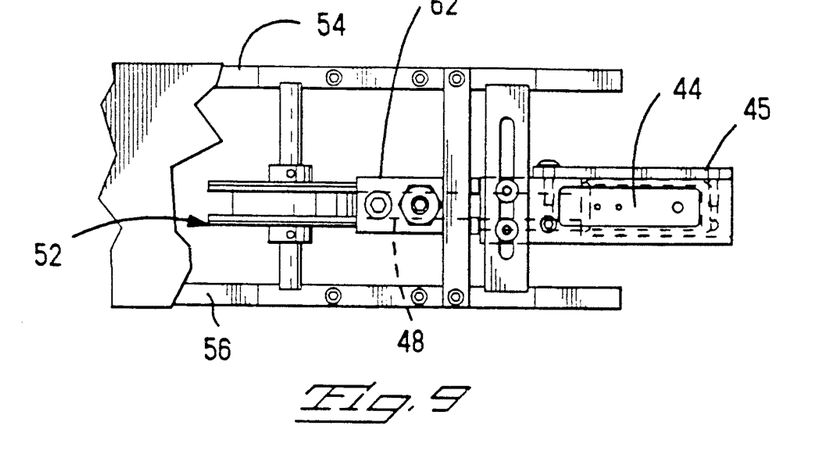
FIG. 9 is a view looking in the direction of the arrows 9—9 of FIG. 8.
Figure 10:
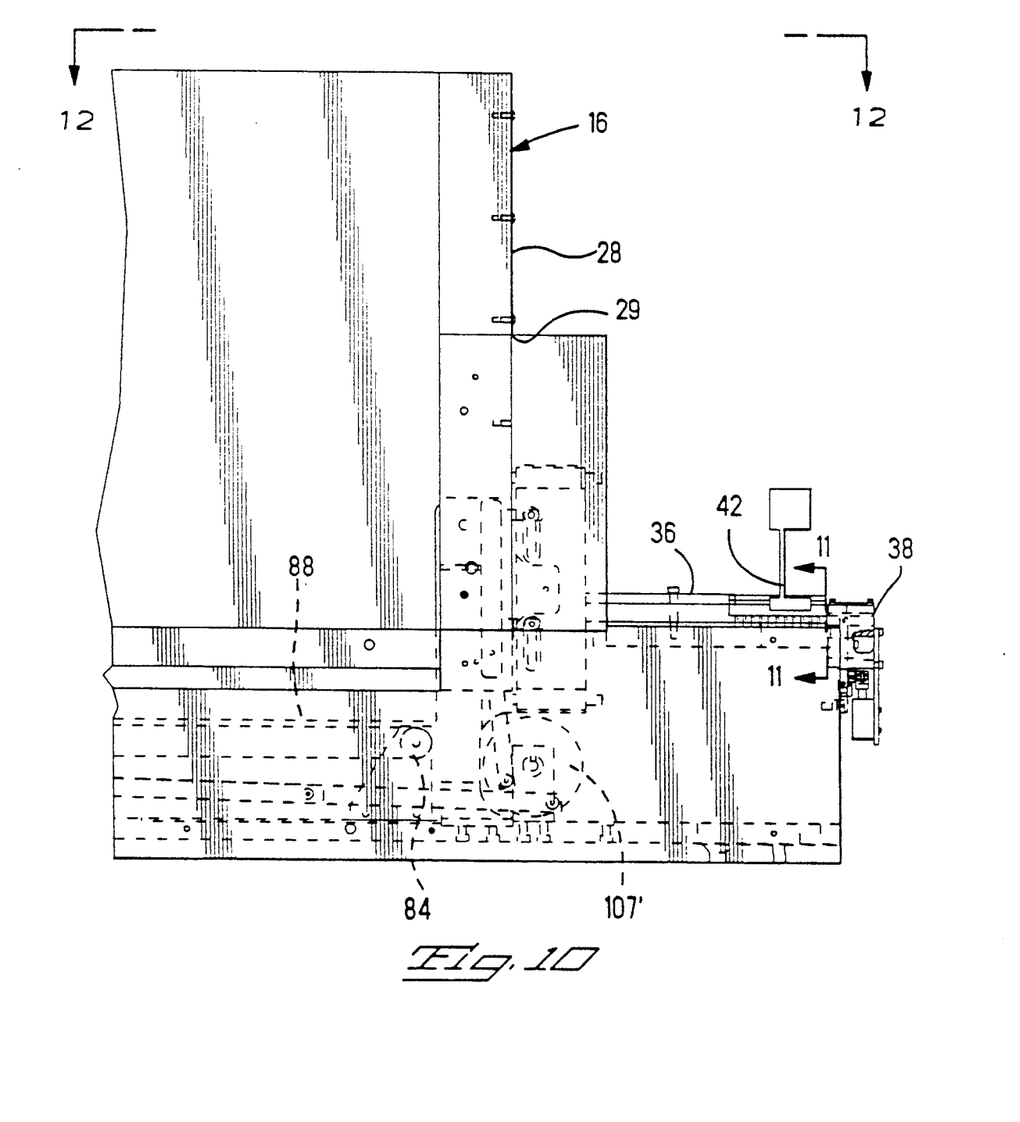
FIG. 10 is a side view of the right-hand side of the apparatus showing portions of a robot arm.
Figure 11:
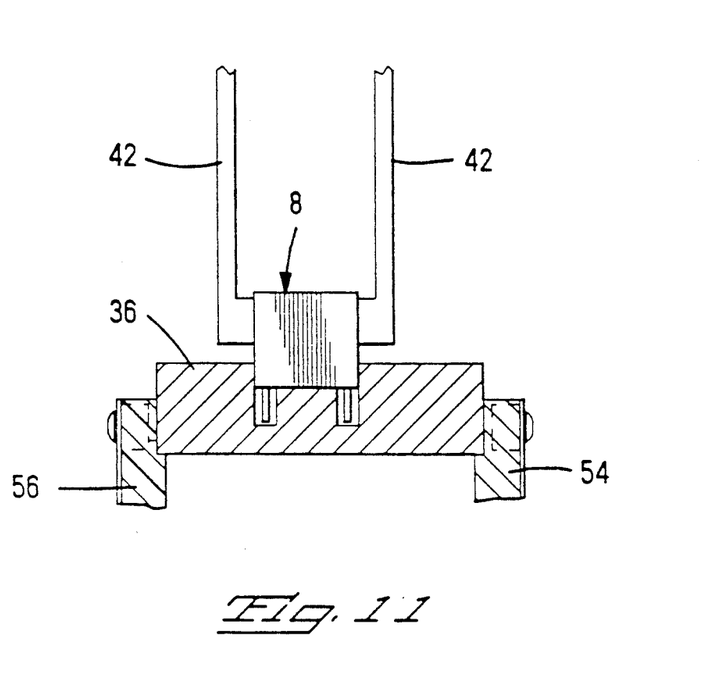
FIGS. 11 and 12 are views looking in the directions of the arrows 11—11 and 12—12 of FIG. 10.
Figure 12:
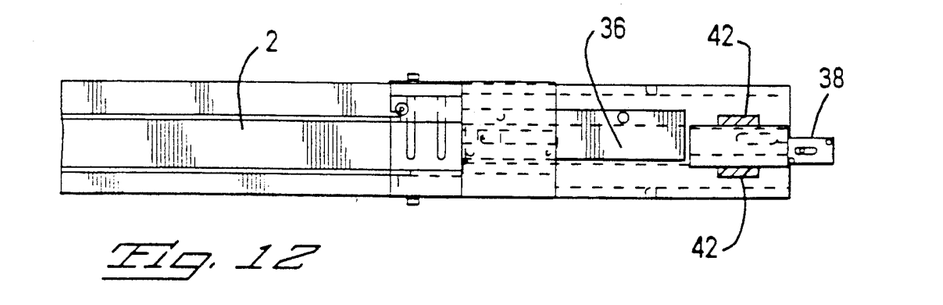

When the apparatus is in service and is being operated continuously, the tubes will be emptied in a relatively short time, and it is desirable to provide a system for removing empty tubes from the machine. The tube ejecting system comprises a conveyor belt 88 which ends around rolls 84, 84' that are adjacent to the first and second column assemblies. The roll 84 is secured to shaft 78 so that when the tape feed rolls 50 are rotated in the direction which feeds tape from the tape housing and through the tube supported on the pins 30, the roll 84 is rotated in a direction which causes the upper course of the conveyor belt to move leftwardly thereby moving a previously ejected empty tube leftwardly from the apparatus. The tube 2 which is being removed by the conveyor is guided by rollers 85, FIG. 7, which are journaled on a shaft supported on one of the side plates. As best shown in FIG. 7, clearance is provided above the belt 88 for the tube so that it can be ejected axially by the conveyor.

The pin 30, which supports, in cooperation with pin 30', the tube in a feeding position, extends from a block 92 which in turn is adjustably secured in a recess in a horizontally reciprocable block 96. The block 92 can be vertically adjusted within the recess and locked in position by a suitable set screw 93. Adjustment of the position of pin 30 is required for different sizes or types of tube magazines. The upper pin 32 is similarly adjustably secured on a block 92 in a recess in block 96.

Figure 3A:
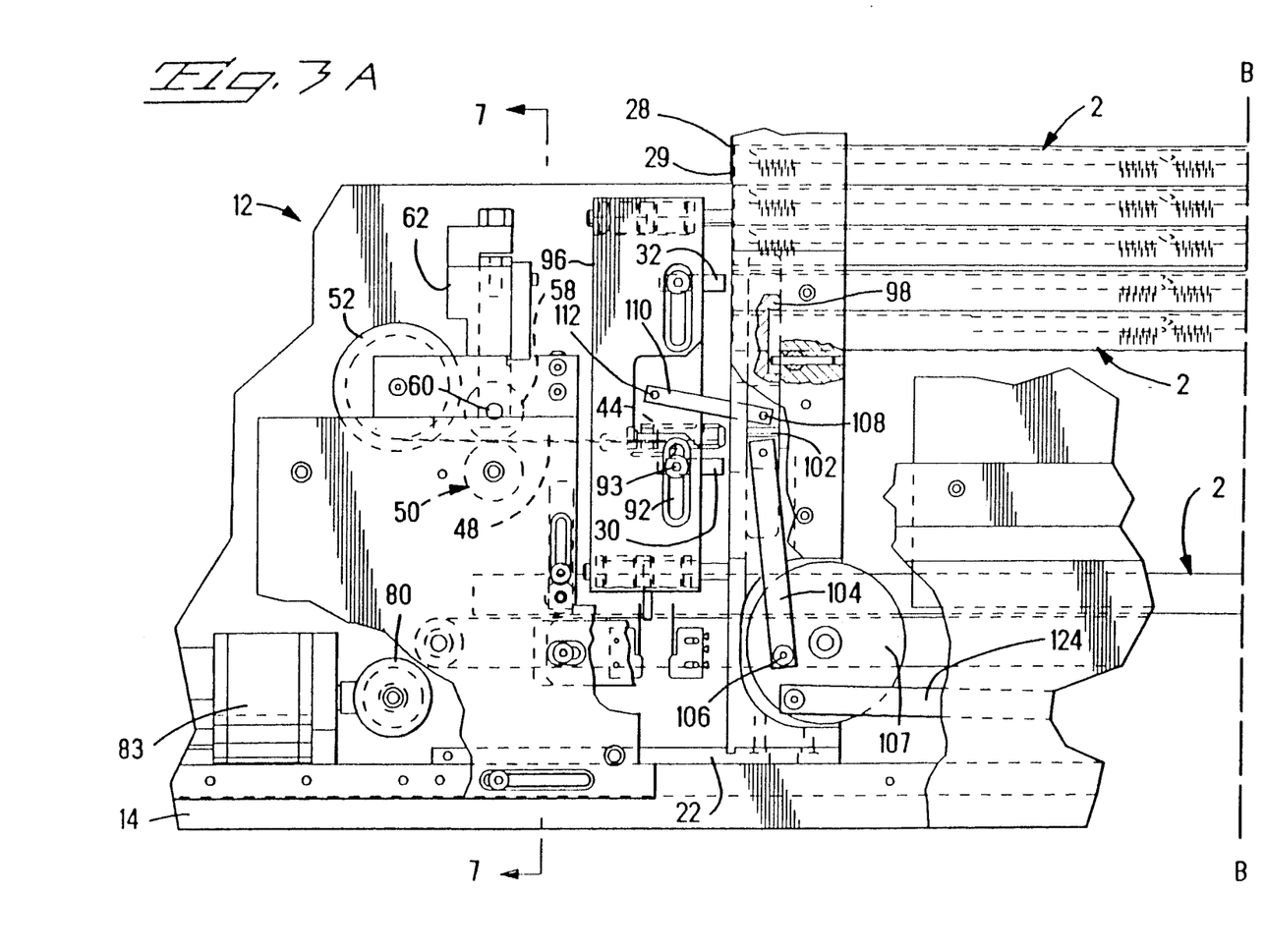

The block 94 is slidably supported on pins 95 which extend from column 20 and is horizontally movable a short distance between the two positions shown in FIGS. 2A and 3A. In the position of FIG. 2A, block 96 is adjacent to column assembly 16 and the pins 30, 32 project into the space between the columns 18, 20 thereby to support tube magazines. The upper pins 32, 32' support an inventory of filled tubes while the lower pins 30, 30' support the tube which is in its feeding position. The horizontal movement of the block 96 is described below.

A slide block 98 (FIG. 5) is provided in a suitable recess 100 in the column 20 and is pivoted at its lower end 102 to a link 104 which in turn extends to a pivotal connection 106 on a disk 107. The disk is oscillated through an angle of about 30 degrees to cause reciprocating vertical movement of the slide block 98. The block 96 is connected by a link 110 to the vertically reciprocable block 98, link 110 being pivoted at 112 and 108 to the blocks 96 and 98, respectively. As shown by FIGS. 2A and 3A, upward movement of the block 98 causes the carrier block 96 to move horizontally away from the column 20 to the position of FIG. 3A and downward movement of block 98 causes the block 96 to move towards the column 20 so that the pins 30, 32 move from, and then back into, their supporting positions.

The intermediate pin 34 extends horizontally into the space between the opposed surfaces 24, 26 of the column members 18, 20 when the parts are in the positions of FIG. 6. When it is in this extended position, it supports a single tube magazine, and when withdrawn to its retracted position, FIG. 5, it releases the tube magazine which then falls down onto the pins 30, 30'. The movement of the intermediate support pin 34 is achieved by a camming plate 122 which is mounted on slide block 98. The camming plate has a cam track 120 therein which receives a cam follower 118 extending from a block 116 which is integral with pin 34. The block 116 is movable horizontally along with the pin 34, and such movement is achieved by the cam follower 118 and cam track 120.

The disk 107 is coupled to a disk 107' by a connecting rod 124 and the disk 107' is oscillated by a motor 126 which is under the control of the control system, the disk 107' being coupled to the motor by a suitable right angle drive.

Figure 14:
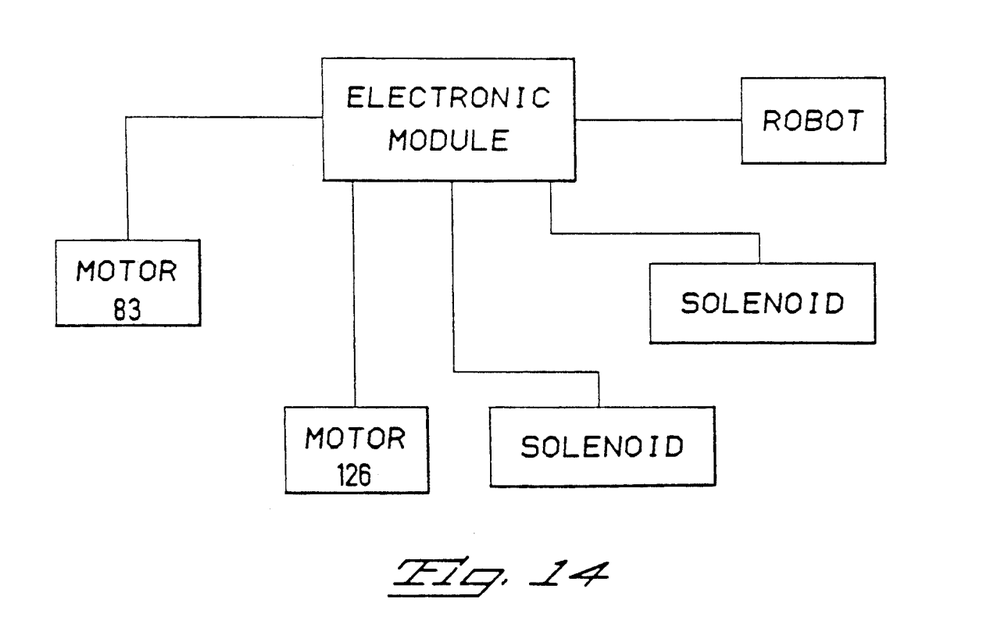
FIG. 14 is a block diagram of a control system for the apparatus.

The control system for the apparatus (FIG. 14) may be a conventional electronic control system composed of a suitable electronic module or microprocessor having conductors extending to the robot, suitable solinoids which control the clamping devices, and to the two motors described above.

The operation of the apparatus is as follows.

An inventory of filled magazines is placed in the apparatus above the pins 32 with the lowermost magazine supported by the pins 32 and the others stacked on top of the lowermost tube magazine of the inventory. At the beginning of an operating cycle, a filled magazine will be supported on the pins 30, 30' and a previously ejected magazine will rest on the conveyor belt. When operation begins, the pusher 44 is moved by the tape 48 into the tube 2 and feeds the leading component in the tube against the stop at the pickup station. The presence of the leading component is sensed, and the robot arm grasps the leading component. A compressive force is retained on the stack of components in the tube by the pusher until the robot arm grips the leading component, at which time a signal is sent which causes the pusher to retract a short distance so that the leading component is unclamped. In other words, the leading component is maintained in a clamped position and therefore is precisely positioned until it is gripped by the robot arm. After the robot arm removes the leading component from the pickup station, the control system operates to rotate the feed rolls and move the next adjacent component to the pickup station. This process continues until the tube supported on the pins 30, 30' is empty, at which time the tape is retracted and the pusher 44 is pulled leftwardly from between the column assemblies and into a pusher housing 45 (FIG. 4). When this motion is sensed by the control system, the disks 107, 107' are rotated in a clockwise direction through an angle of about 30 degrees thereby to withdraw the pins 30, 32 from their supporting positions and move the pins 34, 34' into their supporting positions. A filled tube then drops onto the pins 34, 34' and the disks 107, 107' are rotated in a counter-clockwise direction so that the pins 32, 32' are moved into their supporting positions. The withdrawal of the pins 34, 34' permits the tube magazine which was previously supported thereon to fall by gravity onto the pins 30, 30' in preparation for the next operating cycle.

Figure 13:
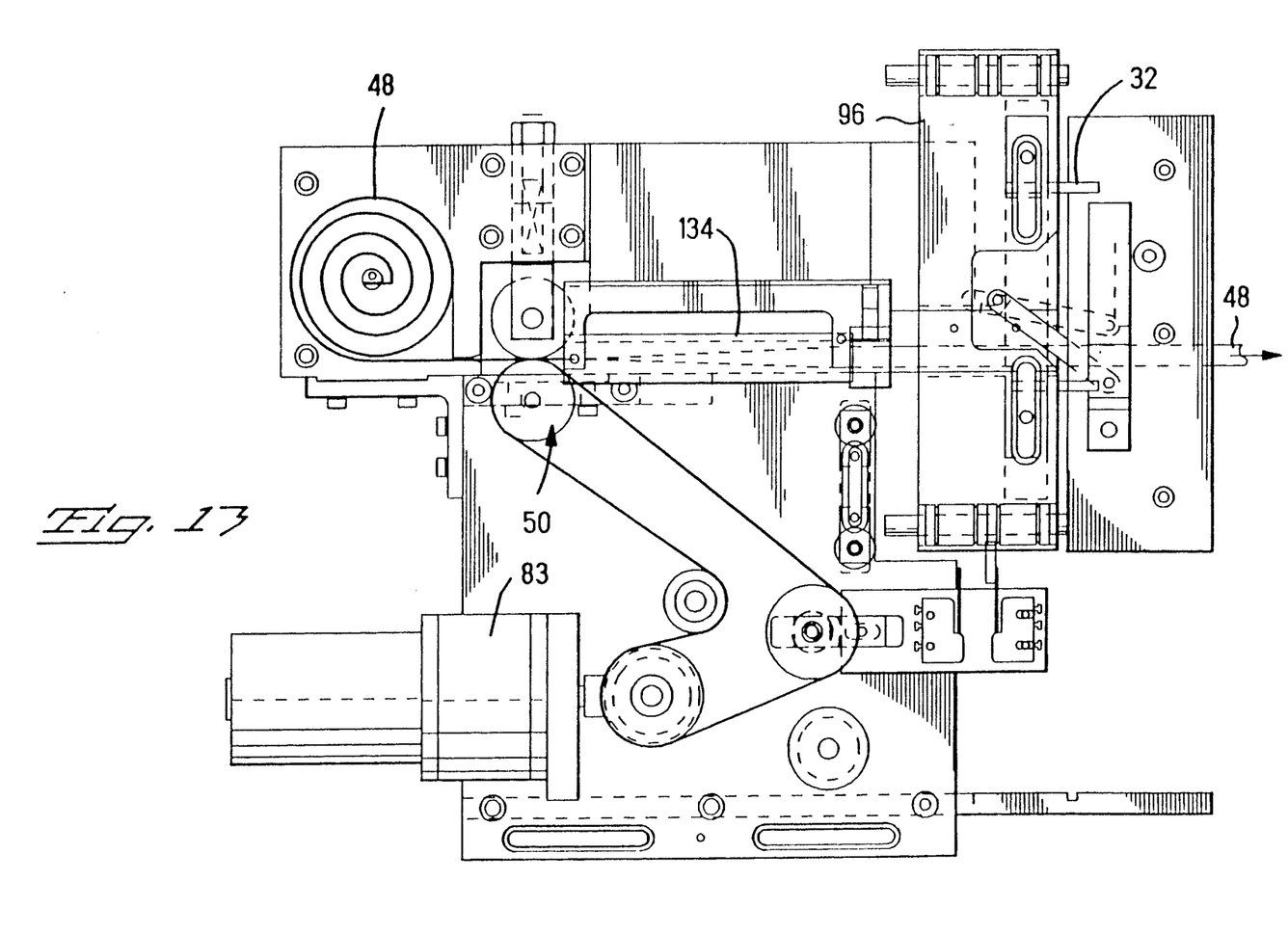
FIG. 13 is a side view showing a tape twisting guide.

FIG. 13 shows a tape twisting guide 134 which twists the tape through an angle of 90 degrees and is required under some circumstances. The guide is located adjacent to the feed rolls and adjacent to the pusher housing. The twisting guide is required when the components, and the magazine tubes are relatively narrow in their horizontal dimension and are relatively tall in a vertical sense. If the tape has a width which is greater than the width of the interior of the tube but less than the vertical dimension thereof, the tape must be twisted so that it will be in a vertical orientation when it moves through the tube. The twisting guide 134 is located between the feed roll assembly 50 and the block 96. In order to provide space for the twisting guide, the feed rolls and the tape housing 52 are moved leftwardly from their positions of FIG. 2A.

Several advantages are achieved by the practice of the invention. The tape and pusher provide an extremely simple and effective system for feeding the components from the tube magazine to the pickup station and the need for two feeding systems as in some prior feeders (a first feeding system for feeding components from the tube to the guide track and a second feeding system for feeding the components along the guide track) is avoided. A further advantage is that a highly effective system is provided for ejecting empty tubes. The empty tubes are moved axially from the apparatus, rather than laterally, a feature which permits the apparatus to be of minimum width. Feeding apparatus of the type described herein are usually mounted side-by-side with identical feeding devices on an assembly machine for assembling circuit boards or the like. It is important that the widths of the feeders be kept to a minimum in order to permit mounting the feeders in the limited space available on the assembly machine.

We claim:

1. Apparatus for feeding articles, such as electronic components, from a tube magazine to an article pick up station, the tube magazine comprising an elongate tube having first and second ends, the articles being against each other in a stack in the tube, the apparatus comprising a tube support for supporting a tube magazine in a horizontal position, article feeding means, and robot means, the pick up station being adjacent to the second end of a tube supported on the tube support, the robot means being adjacent to the pick up station, the apparatus being characterized in that:

a fixed stop is provided at the pick up station, the stop having a sensor which senses a presence of the one article which is against the stop, the one article being designated as a leading article, the article feeding means comprises a flexible tape, tape feeding means, and control means, the tape being contained in a tape housing which is located adjacent to the first end of the tube, the tape having a leading end portion which extends from the tape housing and which has an article pushing means thereon, the article pushing means being in alignment with the first end of the tube at the beginning of an operating cycle, the control means being programmed to actuate the tape feeding means and feed the tape from the tape housing and through the tube towards the second end thereby to push the leading article against the stop, to maintain the leading article against the stop so that the leading article is clamped in a precise position at the pick up station, to thereafter cause the robot to grip the leading article, and to thereafter retract the tape thereby unclamping the leading article whereby, the leading article is precisely positioned when it is gripped by the robot and is thereby precisely positioned in the robot.

2. Apparatus as set forth in claim 1 characterized in that the tube has a rectangular cross-section having a major dimension and a minor dimension, the tape has a width which is greater than the minor dimension and less than the major dimension, the tape being oriented in the tape feeding means such that its width is in the direction of the minor dimension, and a tape twisting means is provided between the feeding means and a tube supported on the tube support to twist the tape through an angle of 90 degrees so that the tape is oriented such that its width is in the direction of the major dimension.

3. Apparatus as set forth in claim 1 characterized in that the tape feeding means comprises feed rolls and a reversible motor for rotating the feed rolls, the motor being controlled by the control means.

* * * * *